United States Patent
Pawlak

(10) Patent No.: US 9,824,933 B1
(45) Date of Patent: Nov. 21, 2017

(54) STACKED VERTICAL-TRANSPORT FIELD-EFFECT TRANSISTORS

(71) Applicant: GLOBALFOUNDRIES Inc., Grand Cayman (KY)

(72) Inventor: Bartlomiej J. Pawlak, Leuven (BE)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/232,174

(22) Filed: Aug. 9, 2016

(51) Int. Cl.
| | |
|---|---|
| *H01L 21/00* | (2006.01) |
| *H01L 21/338* | (2006.01) |
| *H01L 21/337* | (2006.01) |
| *H01L 29/768* | (2006.01) |
| *H01L 29/80* | (2006.01) |
| *H01L 21/8234* | (2006.01) |
| *H01L 29/786* | (2006.01) |
| *H01L 23/522* | (2006.01) |
| *H01L 27/088* | (2006.01) |
| *H01L 29/423* | (2006.01) |

(52) U.S. Cl.
CPC ............. *H01L 21/823487* (2013.01); *H01L 21/823475* (2013.01); *H01L 23/5226* (2013.01); *H01L 27/088* (2013.01); *H01L 29/42392* (2013.01); *H01L 29/78642* (2013.01)

(58) Field of Classification Search
CPC ......... H01L 29/66666; H01L 29/66909; H01L 29/7788; H01L 29/7827; H01L 29/785; H01L 29/78642; H01L 29/7962; H01L 21/823431; H01L 21/823587; H01L 21/823821; H01L 21/823885; H01L 27/0886; H01L 27/0924; H01L 27/10841
USPC ........ 257/220, 263, 328, 330, 331; 438/156, 438/173, 192, 212, 268
See application file for complete search history.

(56) References Cited

U.S. PATENT DOCUMENTS

| | | | | |
|---|---|---|---|---|
| 2016/0104714 A1* | 4/2016 | Endoh | ................ | G11C 16/0425 257/321 |
| 2016/0336340 A1* | 11/2016 | Song | ................ | H01L 27/11582 |
| 2017/0040337 A1* | 2/2017 | Kim | ................ | H01L 27/11582 |

* cited by examiner

*Primary Examiner* — Hsien Ming Lee
(74) *Attorney, Agent, or Firm* — Thompson Hine LLP

(57) ABSTRACT

Structures and fabrication methods for a vertical-transport field-effect transistor. A plurality of pillars comprised of a semiconductor material are formed. First and second gate structures are located along a length of the pillars. The second gate structure is vertically spaced along the length of the pillars relative to the first gate structure. The first and second gate structures are each associated with a channel defined in the pillars.

20 Claims, 2 Drawing Sheets

STACKED VERTICAL-TRANSPORT FIELD-EFFECT TRANSISTORS

BACKGROUND

The present invention relates to semiconductor device fabrication and integrated circuits and, more specifically, to structures for vertical-transport field-effect transistors, as well as methods of fabricating device structures for vertical-transport field-effect transistors.

Traditional transistor structures include a source, a drain, a channel situated between the source and drain, and a gate electrode configured to respond to a gate voltage by selectively connecting the source and drain to each another through the channel. Transistor structures are formed on a surface of a semiconductor substrate, which surface may be considered to be contained in a horizontal plane. Transistor structures can be broadly categorized based upon the orientation of the channel relative to the surface of the semiconductor substrate.

Planar transistors constitute a category of transistor structures in which the channels are oriented parallel to the substrate surface. Vertical transistors represent a different category of transistor structures in which the channels project vertically relative to the substrate surface. Because the gated current between the source and drain is directed through the channel, different types of vertical transistors, namely FinFETs, and vertical-transport field-effect transistors, can also be distinguished from each another based upon the direction of current flow. The gated current in the channel between the source and drain of a FinFET-type vertical transistor is generally parallel to the substrate surface. In contrast, the gated current in the channel between the source and drain in a vertical-transport field-effect transistor is generally perpendicular to the substrate surface.

Improved structures and fabrication methods are needed for vertical-transport field-effect transistors.

SUMMARY

According to an embodiment, a structure includes a plurality of pillars comprised of a semiconductor material, a first gate structure located along a length of the pillars, and a second gate structure located along the length of the pillars. The second gate structure is vertically spaced along the length of the pillars relative to the first gate structure. The first gate structure and the second gate structure are each associated with a respective channel defined in each of the pillars.

According to another embodiment, a method includes forming a plurality of pillars comprised of a semiconductor material, forming a first gate structure located along a length of the pillars, and forming a second gate structure located along the length of the pillars. The second gate structure is vertically spaced along the length of the pillars relative to the first gate structure. The first gate structure and the second gate structure are each associated with a respective channel defined in each of the pillars.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
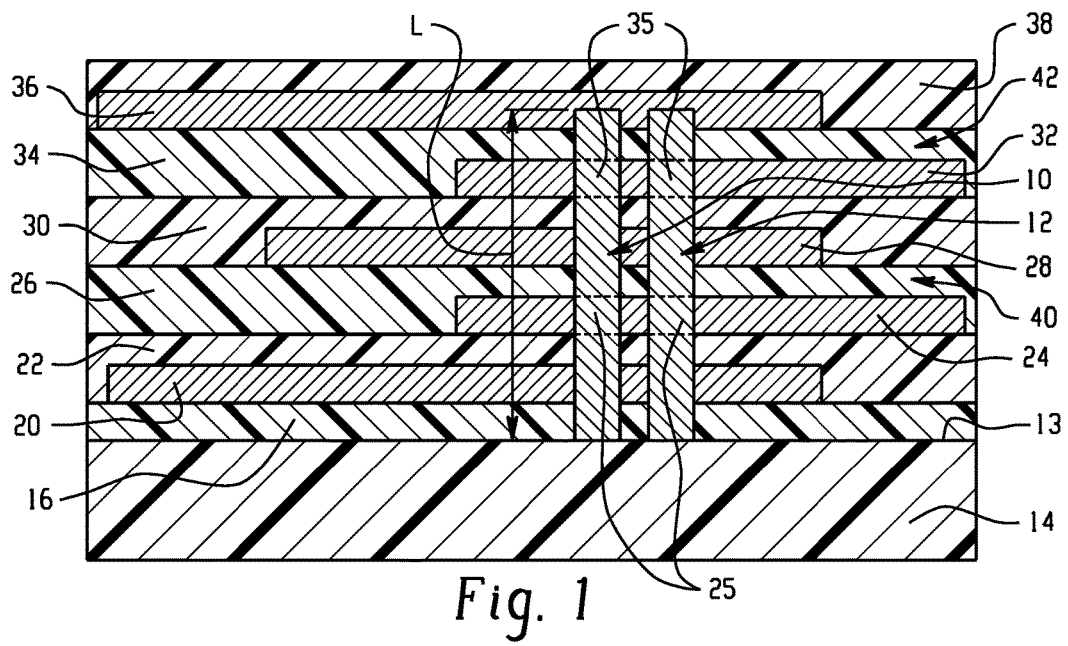
FIG. 1 is a diagrammatic cross-sectional view of a structure for a vertical-transport field-effect transistor fabricated by a processing method in accordance with an embodiment of the invention.

With reference to FIG. 1 and in accordance with an embodiment of the invention, pillars 10, 12 may be formed that are supported on a top surface 13 of a substrate 14, which may be a bulk silicon substrate or a silicon device layer of a semiconductor-on-insulator (SOI) substrate. Each of pillars 10, 12 is a three-dimensional body comprised of a semiconductor material, such as silicon, and is vertically oriented relative to the surface 13 of the substrate 14. The pillars 10, 12 may have a height or length, L, measured relative to the surface 13 of the substrate 14.

The pillars 10, 12 may have any of several suitable geometrical shapes. The pillars 10, 12 may be nanowires that are shaped as tubes, rods, or another elongated cylindrical structures having a width on the order of tens of nanometers, or less, and an unconstrained length. The nanowires may be formed by depositing an epitaxial layer of semiconductor material on the substrate 14, forming a patterned hardmask on the epitaxial layer, and dry etching to remove semiconductor material not protected by the hardmask. The dry etching process may stop on the surface 13 of the substrate 14. Alternatively, the pillars 10, 12 may be fins that originate from the semiconductor material of the substrate 14 and that are formed by photolithography and etching processes, such as a sidewall imaging transfer (SIT) process.

A spacer layer 16 is formed on a top surface of the substrate 14 after the pillars 10, 12 are formed. The spacer layer 16 may be comprised of a dielectric material, such as, but not limited to, silicon nitride ($Si_3N_4$) or silicon dioxide ($SiO_2$). The thickness of the spacer layer 16 is measured in the same direction as the length of the pillars 10, 12. The pillars 10, 12 project through the thickness of the spacer layer 16 with only a fraction of the length of the pillars 10, 12 covered at their respective bases.

A source/drain electrode 20 is formed on a top surface of the spacer layer 16. The source/drain electrode 20 contacts the pillars 10, 12 over its thickness at and above an interface between a bottom surface of the source/drain electrode 20 and a top surface of the spacer layer 16. A dielectric layer 22 may be deposited, planarized, and recessed to encapsulate the source/drain electrode 20. The placement of the source/drain electrode 20 on the spacer layer 16 contrasts with conventional designs in which the source electrode is located in the substrate beneath the spacer layer.

A gate structure 24 is formed on a top surface of the dielectric layer 22 and is separated from the source/drain electrode 20 by the dielectric layer 22. The gate structure 24, is located along the length of the pillars 10, 12 and is spaced vertically along the length of the pillars 10, 12 relative to the source/drain electrode 20. The gate structure 24 contacts the pillars 10, 12 over its thickness at and above an interface between a bottom surface of the gate structure 24 and a top surface of the dielectric layer 22. A dielectric layer 26 may be deposited, planarized, and recessed to encapsulate the gate structure 24. A channel 25 is defined in each of the pillars 10, 12 at the location of overlap by the gate structure 24.

A source/drain electrode 28 is formed on a top surface of the dielectric layer 26. The source/drain electrode 28 is located along the length of the pillars 10, 12 and is spaced vertically along the length of the pillars 10, 12 relative to the gate structure 24. The source/drain electrode 28 contacts the pillars 10, 12 over its thickness at and above an interface between a bottom surface of the source/drain electrode 28 and a top surface of the dielectric layer 26. A dielectric layer 30 may be deposited, planarized, and recessed to encapsulate the source/drain electrode 28.

A gate structure 32 is formed on a top surface of the dielectric layer 22 and is separated from the source/drain electrode 28 by the dielectric layer 30. The gate structure 32 is located along the length of the pillars 10, 12 and is spaced vertically along the length of the pillars 10, 12 relative to the gate structure 24. The gate structure 32 contacts the pillars 10, 12 over its thickness at and above an interface between a bottom surface of the gate structure 32 and a top surface of the dielectric layer 30. In an embodiment, the gate structure 32 may extend about the entire perimeter of the pillars 10, 12 in a gate-all-around design. A channel 35 is defined in each of the pillars 10, 12 at the location of overlap by the gate structure 32. A dielectric layer 34 may be deposited, planarized, and recessed to encapsulate the gate structure 32.

A source/drain electrode 36 is formed on a top surface of the dielectric layer 34. The source/drain electrode 36 is located along the length of the pillars 10, 12 and is spaced vertically along the length of the pillars 10, 12 relative to the gate structure 32. The source/drain electrode 36 contacts the pillars 10, 12 over its thickness at and above an interface between a bottom surface of the source/drain electrode 36 and a top surface of the dielectric layer 34. A dielectric layer 38 may be deposited and planarized to encapsulate the source/drain electrode 36.

Multiple vertical-transport field-effect transistors, generally indicated by reference numerals 40, 42, have a stacked arrangement as unit device structures along the length of the pillars 10, 12 and a gate-all-around design. The source/drain electrode 28 may constitute either a common drain electrode or a common source electrode that is shared by the gate structure 24 and associated channel 25 of the vertical field-effect transistor 40 including and the gate structure 32 and its associated channel 35 of the vertical field-effect transistor 42. As used herein, the term "source/drain electrode" means an electrode that can function as either a source or a drain of a field effect transistor as designated in the design of the device structure. In an embodiment, the source/drain electrode 28 functions as a common drain electrode, and the source/drain electrodes 20, 36 function as respective separate source electrodes. In an alternative embodiment, the source/drain electrode 28 may constitute a common source electrode for the vertical-transport field-effect transistors 40, 42, and the source/drain electrodes 20, 36 may constitute respective separate drain electrodes spaced along the length of the pillars 10, 12.

The source/drain electrode 20 that is interfaced with the bottom end of the pillars 10, 12 proximate to the substrate 10 and spacer layer 16, and the source/drain electrode 36 that is interfaced with the top end of the pillars 10, 12 remote from the substrate 10 and spacer layer 16. The source/drain electrodes 20, 36 are located proximate to the opposite ends of the pillars 10, 12. The gate structure 32 is vertically spaced along the length of the pillars 10, 12 relative to the gate structure 24. The gate structures 24, 32 are vertically located between the source/drain electrodes 20, 36 with gate structure 24 specifically located vertically between the source/drain electrode 20 and the source/drain electrode 28 and with gate structure 32 specifically located vertically between the source/drain electrode 36 and the source/drain electrode 28. In a common source or drain design, the source/drain electrode 20 is shared by the vertical-transport field-effect transistors 40, 42.

The source/drain electrodes 20, 36, the source/drain electrode 28, and the gate electrodes of the gate structures 24, 32 may be shaped as rectangular planar layers having locations relative to the pillars 10, 12 and respective outer perimeters that facilitate the formation of contacts. The thickness of the respective planar layers is measured in the same direction as the length of the pillars 10, 12. The planar layers have a thickness that is penetrated by the pillars 10, 12 along their length, and the planar layers have a length and width establishing the perimeter that are oriented orthogonal to the length of the pillars 10, 12.

During device operation, the portion of each of the pillars 10, 12 that is covered by the gate structures 24, 32 constitutes channels 25, 35 for gated carrier flow in a vertical direction between the source/drain electrode 28 and the source/drain electrodes 20, 36. The vertical direction of the gated current in the channels 25, 35 is generally perpendicular to the top surface 13 of substrate 10. Depending on device design, the gated current may flow away from the source/drain electrode 28 to the source/drain electrodes 20, 36, or flow from the source/drain electrodes 20, 36 to the source/drain electrode 28.

The dielectric layers 22, 26, 30, 34, 38 may be comprised of a dielectric material, such as an oxide of silicon (e.g., silicon dioxide ($SiO_2$)) deposited by chemical vapor deposition (CVD). The final thicknesses of the different dielectric layers 22, 26, 30, 34 are selected to provide given vertical spacings between adjacent (i.e., nearest neighbor) pairs of the source/drain electrodes 20, 36, source/drain electrode 28, and gate structures 24, 32 in the vertical arrangement.

The gate structures 24, 32 may include a gate dielectric that is applied as a layer to the respective exterior surfaces of the pillars 10, 12, and a layer of an electrically conductive material is deposited and patterned using photolithography and etching processes to define a gate electrode. The gate dielectrics of the gate structures 24, 32 may be comprised of an electrical insulator with a dielectric constant (e.g., a permittivity) characteristic of a dielectric material. For example, the gate dielectric may be comprised of a dielectric material that is electrically insulating against conduction, such as silicon dioxide, silicon oxynitride, a high-k dielectric material like hafnium oxide or hafnium oxynitride, or a layered combination of these dielectric and other insulating materials, deposited by CVD, ALD, etc.

The source/drain electrodes 20, 36, the source/drain electrode 28, and the gate electrodes of the gate structures 24, 32 may be comprised of a conductor, such as a metal, a silicide, polycrystalline silicon (e.g., polysilicon), or a combination of these materials deposited by physical vapor deposition (PVD), CVD, silicidation, etc. In an embodiment, the gate electrodes of the gate structures 24, 32 the source/drain electrodes 20, 36, and the source/drain electrode 28 may be comprised of tungsten (W) deposited by CVD in a CVD reactor using tungsten hexafluoride ($WF_6$) as the tungsten source, and etched using a plasma etch in a plasma etch tool by reactive-ion etching (RIE), using sulfur hexafluoride ($SF_6$) as a source gas. In each instance, a layer of tungsten may be formed and an etch mask may be applied to the tungsten layer in order to locate the respective electrode relative to the pillars 10, 12 and to define its dimensions. To that end, a resist layer may be applied to the deposited layer, exposed to a pattern of radiation projected through a photomask, and developed to form an etch mask having the shape of the respective electrode and defining its location relative to the pillars 10, 12. The patterned resist layer is used as an etch mask for the dry etching process that removes portions of the deposited tungsten layer that is not covered by the etch mask.

The current-handling capability of the vertical-transport field-effect transistors 40, 42 is increased by device stacking relying on the same channel material of the pillars 10, 12 and utilizing a common source/drain electrode 28. In particular, the channel current-handling capability is multiplied by the presence of multiple gated channels 25, 35 in each of the pillars 10, 12. For example, the representative device structure stacks two vertical-transport field-effect transistors 40, 42 that share different sections of pillars 10, 12, which may double the amount of the device current-handling capability. In an alternative embodiment, the number of pillars 10, 12 may be increased to more than the number in the representative embodiment. In another alternative embodiment, additional source/drain electrodes and gate structures may be added along the length of the pillars 10, 12 in order to add additional vertical-transport field-effect transistors to the stacked arrangement.

Figure 2:
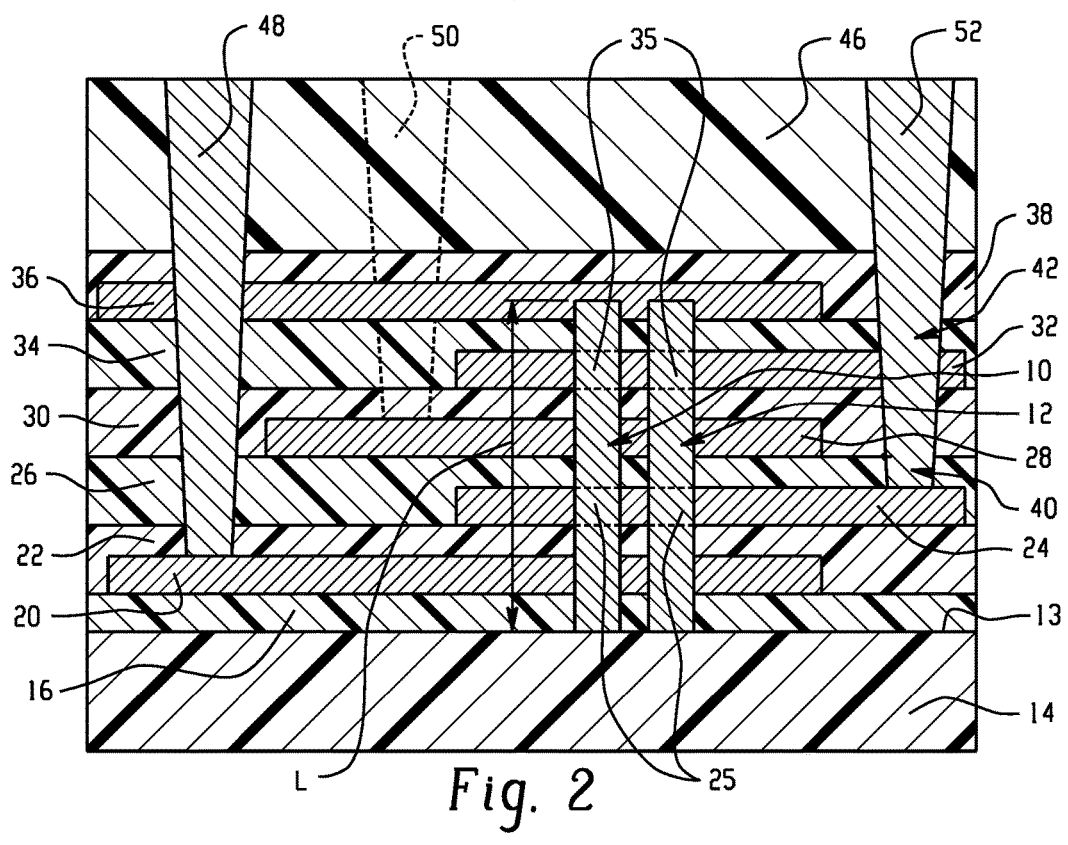
FIG. 2 is a diagrammatic cross-sectional view similar to FIG. 1 at a subsequent stage of the processing method.

With reference to FIG. 2 in which like reference numerals refer to like features in FIG. 1 and at a subsequent fabrication stage, middle-of-line (MOL) and back-end-of-line (BEOL) processing follows, which includes formation of contacts and wiring for the local interconnect structure interfaced with the vertical-transport field-effect transistors 40, 42, and formation of dielectric layers, via plugs, and wiring for an interconnect structure coupled by the interconnect wiring with the vertical-transport field-effect transistors 40, 42, as well as other similar contacts for additional device structures like vertical-transport field-effect transistors 40, 42. Other active and passive circuit elements, such as diodes, resistors, capacitors, varactors, and inductors, may be integrated into the interconnect structure and available for use in the integrated circuit.

In particular, a dielectric layer 46 of a CA level is deposited on the source/drain electrode 36 and dielectric layer 34 as part of the MOL processing. Contacts, such as the representative contacts 48, 50, 52 are formed in the dielectric layer 46 and used to contact the source/drain electrodes 20, 36, the source/drain electrode 28, and the gate electrodes of the gate structures 24, 32. The dielectric layer 46 is comprised of an electrically-insulating dielectric material, such as an oxide of silicon (e.g., silicon dioxide ($SiO_2$)) deposited by CVD. The contacts 48, 50, 52 may be formed from a conductor, such as a metal like tungsten (W), and may be clad with a conductive liner (e.g., titanium nitride (TiN)).

Contact 48 contacts the source/drain electrode 36 and penetrates through the dielectric layers 22, 26, 30, 34 to contact the source/drain electrode 20. Contact 50 penetrates through dielectric layers 30, 34, 38 to contact the source/drain electrode 28 and is electrically isolated by the electrically-insulating material of the dielectric layers 30, 34, 38 from the source/drain electrode 36. The gate contact 52 penetrates through dielectric layers 34, 38 to contact the gate electrode of gate structure 32 and further penetrates through dielectric layers 26, 30 to contact the gate electrode of gate structure 24. The contacts 48, 50, 52 may include multiple identical elements, rather than the single element show for ease of illustration.

The arrangement of the gate electrodes of the respective gate structures 24, 32, the source/drain electrodes 20, 36, and the source/drain electrode 28 permits the contacts 48, 50, 52 to be placed in the layout to extend parallel to the length of the pillars 10, 12. The placement of the contacts 48, 50, 52 such that the pillars 10, 12 are located horizontally between at least one of the contacts 48, 50, 52 and another of the contacts 48, 50, 52 contrasts with conventional designs in which all contacts are located on the same side and the electrodes above the substrate merely have lengths that are tiered to permit the establishment of contact.

In the representative embodiment, the gate contact 52 is offset from the contacts 48, 50 because the source/drain electrode 36 and the source/drain electrode 28 do not overlap vertically with the gate electrodes of the gate structures 24, 32. The gate contact 52 can be placed in the layout to avoid intersecting the source/drain electrode 36 and the source/drain electrode 28. Similarly, the contact 50 is offset from the contact 48 because the source/drain electrode 28 does not overlap vertically with the gate electrodes of the gate structures 24, 32 and the source/drain electrode 36. The contact 50 can be placed in the layout to avoid intersecting the gate electrodes of the gate structures 24, 32 and the source/drain electrode 36. Likewise, the contact 48 is offset from the contact 50 because the source/drain electrodes 20, 36 do not overlap vertically with the gate electrodes of the gate structures 24, 32 and the source/drain electrode 28. The contact 48 can be placed in the layout to avoid intersecting the gate electrodes of the gate structures 24, 32 and the source/drain electrode 28.

Figure 3:
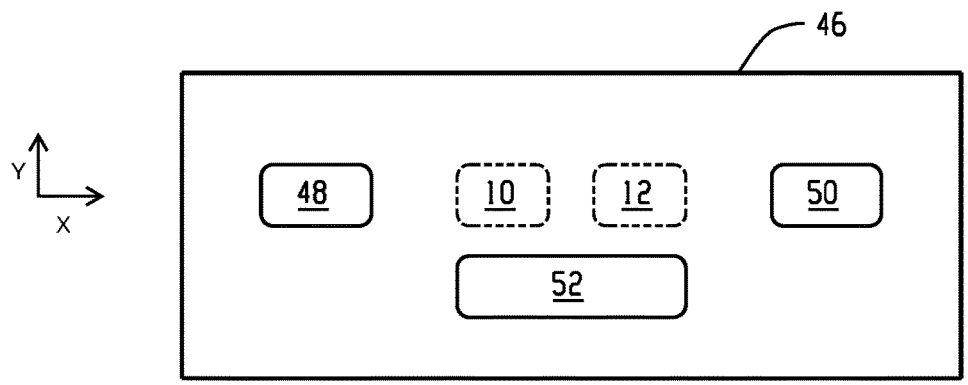
FIGS. 3-5 are top views of structures in which different representative layouts for the pillars and contacts are illustrated.

With reference to FIG. 3 in which like reference numerals refer to like features in FIGS. 1, 2 and in accordance with an embodiment, the pillars 10, 12 may be located between the contact 48 extending through dielectric layer 46 to the source/drain electrode 36 and the contact 50 extending through dielectric layer 46 to the source/drain electrode 28. In particular, the contacts 48, 50 are symmetrically arranged relative to the pillars 10, 12 in an x-direction in an x-y plane. The contact 52 is offset from the pillars 10, 12 in the transverse y-direction in the x-y plane and is located along the x-direction between the contact 48 and the contact 50. The arrangement of the source/drain electrodes 20, 36, the source/drain electrode 28, and the gate structures 24, 32 within the vertical-transport field-effect transistors 40, 42 facilitates the arrangement of the contacts 48, 50, 52.

Figure 4:
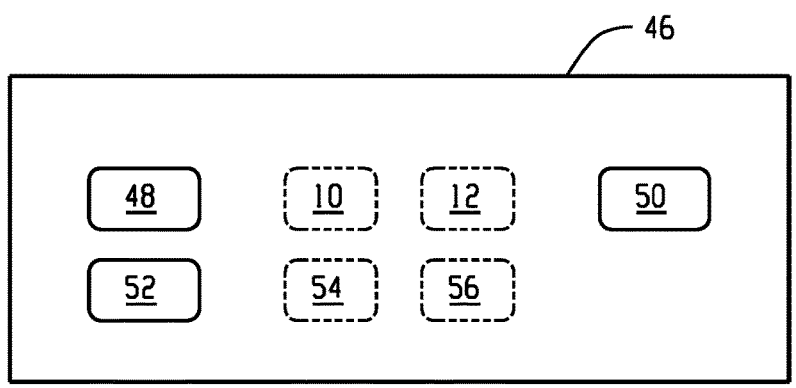

With reference to FIG. 4 in which like reference numerals refer to like features in FIG. 3 and in accordance with an alternative embodiment, the contacts 48, 50, 52 may be rearranged in comparison with the arrangement in FIG. 3, and additional pillars 54, 56, which have the same construction as the pillars 10, 12, may be present in the configuration of the vertical-transport field-effect transistors 40, 42. The pillars 10, 12, 54, 56 are arranged in a two-dimensional array. The contact 48 and the gate contact 52 may be located on one side of the pillars 10, 12, 54, 56 in the x-direction. The contact 50 may be located on an opposite side of the pillars 10, 12, 54, 56 in the x-direction such that the pillars 10, 12, 54, 56 are all located between the contact 50 and the contacts 48, 52. The contacts 48, 50 are still symmetrically arranged relative to the pillars 10, 12 in the x-direction in an x-y plane, and the contact 52 is offset from the pillars 10, 12 in the transverse y-direction in the x-y plane, albeit in alignment with the contact 48 in the y-direction.

Figure 5:
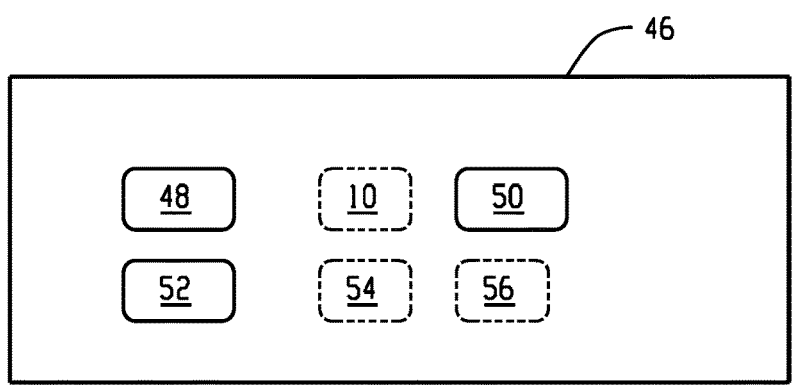

With reference to FIG. 5 in which like reference numerals refer to like features in FIG. 4 and in accordance with an alternative embodiment, the contacts 48, 50, 52 may be rearranged in comparison with the arrangement in FIG. 4. The contact 48 and the gate contact 52 may be located on one side of the pillars 10, 12, 54 in the x-direction and the contact 50 may be located within the arrangement of the pillars 10, 54, 56 such that only the pillars 10, 54 are located in the x-direction between the contact 50 and the contacts 48, 52. The contact 50 is offset from the other pillar 56 in the y-direction.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smart-phones.

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refers to a direction perpendicular to the horizontal, as just defined. The term "lateral" refers to a direction within the horizontal plane. Terms such as "above" and "below" are used to indicate positioning of elements or structures relative to each other as opposed to relative elevation.

A feature may be "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
    a plurality of pillars comprised of a semiconductor material;
    a first gate structure located along a length of the pillars;
    a second gate structure located along the length of the pillars and vertically spaced along the length of the pillars relative to the first gate structure; and
    a first source/drain electrode located along the length of the pillars between the first gate structure and the second gate structure,
    wherein the first source/drain electrode is arranged in direct contact with the pillars, and the first gate structure and the second gate structure are each associated with a respective channel defined in each of the pillars.

2. The structure of claim 1 wherein the first source/drain electrode is common to the channel of the first gate structure and the channel of the second gate structure.

3. The structure of claim 2 further comprising:
    a second source/drain electrode located along the length of the pillars; and
    a third source/drain electrode located along the length of the pillars,
    wherein the first source/drain electrode is vertically located between the second source/drain electrode and the third source/drain electrode.

4. The structure of claim 3 wherein the first gate structure is located between the first source/drain electrode and the second source/drain electrode, and the second gate structure is located between the first source/drain electrode and the third source/drain electrode.

5. The structure of claim 3 further comprising:
    a first contact coupled with a gate electrode of the first gate structure and with a gate electrode of the second gate structure;
    a second contact coupled with the first source/drain electrode; and
    a third contact coupled with the second source/drain electrode and with the third source/drain electrode,
    wherein the first contact, the second contact, and the third contact extend parallel to the length of the pillars.

6. The structure of claim 5 wherein at least one of the pillars is laterally located between the first contact and the second contact.

7. The structure of claim 5 wherein at least one of the pillars is laterally located between the second contact and the third contact.

8. The structure of claim 1 wherein the length of the pillars is vertically oriented relative to a surface of a substrate on which the pillars are supported.

9. The structure of claim 1 further comprising:
    a second source/drain electrode located along the length of the pillars,
    wherein the first gate structure and the second gate structure are vertically located between the first source/drain electrode and the second source/drain electrode.

10. The structure of claim 1 wherein the pillars are nanowires comprised of the semiconductor material.

11. The structure of claim 1 wherein the first gate structure and the second gate structure each include a planar gate electrode, and the pillars penetrate through the gate electrode of the first gate structure and the gate electrode of the second gate structure.

12. The structure of claim 1 further comprising:
    a dielectric spacer layer on the substrate; and
    a second source/drain electrode on the dielectric spacer layer and located along the length of the pillars between the first gate structure and the dielectric spacer layer,
    wherein the pillars vertically penetrate through the dielectric spacer layer.

13. The structure of claim 1 wherein the first gate structure and the second gate structure each include a gate electrode, and the gate electrode of the first gate structure, the gate electrode of the second gate structure, and the first source/drain electrode are planar layers located along the length of the pillars.

14. A method comprising:
    forming a plurality of pillars comprised of a semiconductor material;

forming a first gate structure located along a length of the pillars;

forming a second gate structure located along the length of the pillars and vertically spaced along the length of the pillars relative to the first gate structure; and forming a first source/drain electrode located along the length of the pillars between the first gate structure and the second gate structure, wherein the first source/drain electrode is arranged in direct contact with the pillars, and the first gate structure and the second gate structure are each associated with a respective channel defined in each of the pillars.

15. The method of claim 14 wherein the first source/drain electrode is common to the channel of the first gate structure and the channel of the second gate structure.

16. The method of claim 15 further comprising:

forming a second source/drain electrode located along the length of the pillars; and forming a third source/drain electrode located along the length of the pillars, wherein the first source/drain electrode is vertically located between the second source/drain electrode and the third source/drain electrode.

17. The method of claim 16 wherein the first gate electrode is located between the first source/drain electrode and the second source/drain electrode, and the second gate electrode is located between the first source/drain electrode and the third source/drain electrode.

18. The method of claim 14 wherein the length of the pillars is vertically oriented relative to a surface of a substrate on which the pillars are supported.

19. The method of claim 14 further comprising:

forming a second source/drain electrode located along the length of the pillars, wherein the first gate structure and the second gate structure are vertically located between the first source/drain electrode and the second source/drain electrode.

20. The method of claim 14 wherein the length of the pillars is vertically oriented relative to a surface of a substrate on which the pillars are supported, and further comprising:

forming a dielectric spacer layer on the substrate, wherein the pillars vertically penetrate through the dielectric spacer layer.

\* \* \* \* \*